(12) United States Patent
Olariu

(10) Patent No.: US 10,958,277 B1
(45) Date of Patent: Mar. 23, 2021

(54) PLL WITH MULTIPLE AND ADJUSTABLE PHASE OUTPUTS

(71) Applicant: Cobham Colorado Springs Inc., Colorado Springs, CO (US)

(72) Inventor: Viorel Olariu, Colorado Springs, CO (US)

(73) Assignee: Cobham Colorado Springs Inc., Colorado Springs, CO (US)

( * ) Notice: Subject to any disclaimer, the term of this patent is extended or adjusted under 35 U.S.C. 154(b) by 0 days.

(21) Appl. No.: 16/562,377

(22) Filed: Sep. 5, 2019

(51) Int. Cl.
| *H03L 7/099* | (2006.01) |
| *H04L 1/00* | (2006.01) |
| *H03L 7/081* | (2006.01) |
| *H03L 7/06* | (2006.01) |
| *H04L 7/00* | (2006.01) |

(52) U.S. Cl.
CPC .............. *H03L 7/0996* (2013.01); *H03L 7/06* (2013.01); *H03L 7/0814* (2013.01); *H03L 7/0995* (2013.01); *H04L 1/0036* (2013.01); *H04L 7/0079* (2013.01)

(58) Field of Classification Search
CPC ....... H03L 7/0996; H03L 7/0814; H03L 7/06; H03L 7/0995; H04L 1/0036; H04L 7/0079; G06F 1/06; G09G 5/008; G11B 20/1025
USPC ......................................................... 375/376
See application file for complete search history.

(56) References Cited

U.S. PATENT DOCUMENTS

| 5,576,665 | A | 11/1996 | Erhage |
| 5,614,868 | A | 3/1997 | Nielson |
| 5,786,953 | A | 7/1998 | Kalfs |
| 5,861,780 | A | 1/1999 | Fukuda |
| 6,163,224 | A | 12/2000 | Araki et al. |
| 6,181,213 | B1 | 1/2001 | Chang |
| 6,683,501 | B2 | 1/2004 | Wang et al. |
| 7,126,432 | B2 | 10/2006 | Roubadia et al. |
| 7,724,862 | B2 | 5/2010 | Menolfi et al. |
| 7,898,306 | B1 | 3/2011 | Cheng |
| 8,866,556 | B2 | 10/2014 | Rogers |
| 2003/0182618 | A1* | 9/2003 | Chen ................. H03M 13/6502 714/794 |
| 2003/0198311 | A1 | 10/2003 | Song et al. |
| 2007/0285176 | A1 | 12/2007 | North |
| 2008/0094113 | A1* | 4/2008 | Kuan ..................... H03K 23/68 327/117 |

(Continued)

*Primary Examiner* — Leila Malek
(74) *Attorney, Agent, or Firm* — Morgan, Lewis & Bockius LLP

(57) ABSTRACT

This application is directed to an electronic device including a phase locked loop (PLL) circuit. The PLL includes a voltage-controlled oscillator (VCO) and the PLL is configured to generate a plurality of periodic signals having a first frequency. Optionally, the periodic signals are equally separated in phase to cover an entire period cycle of the first frequency. The electronic device includes a first multiplexer coupled to the PLL, the first multiplexer being external to the PLL. The first multiplexer configured to receive a first selection signal, select a first periodic signal of the plurality of periodic signals based on the first selection signal, and provide the first selected periodic signal to a first clock-driven circuit that is distinct from the PLL. The electronic device further includes a controller circuit coupled to the first multiplexer, the controller circuit being configured to provide the first selection signal to the first multiplexer.

20 Claims, 12 Drawing Sheets

(56) References Cited

U.S. PATENT DOCUMENTS

| | | | | |
|---|---|---|---|---|
| 2009/0243679 A1* | 10/2009 | Smith | ............... | H03L 7/07 |
| | | | | 327/158 |
| 2009/0261911 A1* | 10/2009 | Watanabe | ............ | H03K 3/0315 |
| | | | | 331/57 |
| 2013/0266089 A1* | 10/2013 | McCune, Jr. | ............ | H03C 5/00 |
| | | | | 375/298 |
| 2016/0173075 A1* | 6/2016 | Tanihira | ............. | H03K 5/15013 |
| | | | | 327/295 |

* cited by examiner

1100

1102
Providing a PLL circuit including a VCO, the PLL circuit configured to generate a plurality of periodic signals having a first frequency, each of the plurality of periodic signals having a distinct phase. Optionally, the plurality of periodic signal is separated in phase to cover an entire period cycle of the first frequency.

1104
Providing a first multiplexer coupled to the PLL circuit, the first multiplexer being external to the PLL and configured to receive a first selection signal, select a first periodic signal of the plurality of periodic signals based on the first selection signal and provide the first selected periodic signal to a first clock-driven circuit that is distinct from the PLL

1106
The first selected periodic signals is selected to compensate a phase mismatch in an output of the first clock-driven circuit and synchronize the output of the first clock-driven circuit

1108
Providing a second multiplexer coupled to the PLL circuit, the second multiplexer being configured to receive a second selection signal and select a second periodic signal of the plurality of periodic signals based on the second selection signal, wherein the second multiplexer is distinct from and operates independently from the first multiplexer, and the controller circuit is further coupled to the second multiplexer, the controller circuit being configured to provide the second selection signal to the second multiplexer

1110
The first selection signal of the first multiplexer and the second selection signal of the second multiplexer are the same at a first time, allowing the first and second multiplexers to select the same one of the plurality of periodic signals separately, and the first selection signal of the first multiplexer and the second selection signal of the second multiplexer are different from each other at a second time distinct from the first time, allowing the first and second multiplexers to select two distinct ones of the plurality of periodic signals

1112
The second multiplexer is external to the PLL and configured to provide the second selected periodic signal to a second clock-driven circuit that is distinct from the first clock-driven circuit, and the first and second periodic signals are selected to compensate a phase mismatch in outputs of the first and second clock-driven circuits and synchronize the outputs of the first and second clock-driven circuits

1104 (Cont.)
Providing a first multiplexer coupled to the PLL circuit, the first multiplexer being external to the PLL and configured to receive a first selection signal, select a first periodic signal of the plurality of periodic signals based on the first selection signal and provide the first selected periodic signal to a first clock-driven circuit that is distinct from the PLL

1114
The controller circuit is coupled to the first clock-driven circuit and configured to receive a clock feedback signal from the first clock-driven circuit

1116
The first multiplexer is configured to select two distinct periodic signals sequentially and add a predetermined delay time between sequential selections of the two distinct periodic signals.

1118
The two distinct periodic signals include the first periodic signal and an alternative periodic signal that is selected subsequently to the first periodic signal, the first selection signal including a selection phase adjustment determined by the predetermined delay time, such that the first multiplexer is configured to delay selection of the alternative periodic signal by the predetermined tristate time.

1120
Providing a controller circuit coupled to the first multiplexer, the controller circuit being configured to provide the first selection signal to the first multiplexer.

Figure 11B ic device includes a first multiplexer coupled to the PLL circuit, and the first multiplexer is external to the PLL. The first multiplexer is configured to receive a first selection signal, select a first periodic signal of the plurality of periodic signals based on the first selection signal, and provide the first selected periodic signal to a first clock-driven circuit that is distinct from the PLL. The electronic device further includes a controller circuit coupled to the first multiplexer, where the controller circuit is configured to provide the first selection signal to the first multiplexer. In some implementations, the electronic device further includes a second multiplexer coupled to the PLL circuit. The second multiplexer is configured to receive a second selection signal and select a second periodic signal of the plurality of periodic signals based on the second selection signal. The second multiplexer is distinct from and operates independently from the first multiplexer. The controller circuit is further coupled to the second multiplexer, where the controller circuit is configured to provide the second selection signal to the second multiplexer.

PLL WITH MULTIPLE AND ADJUSTABLE PHASE OUTPUTS

TECHNICAL FIELD

The disclosed embodiments relate generally to phase locked loop (PLL) circuits, and in particular to methods and systems of providing one or more phased clock signals to drive electronic circuits.

BACKGROUND

Phase locked loop (PLL) circuits are widely used in electronic devices for clock synchronization, signal demodulation, and frequency synthesis. A PLL circuit is generally a control system that generates an output signal with a frequency and phase related to that of a fixed reference signal (e.g., an input signal). In its simplest form, the PLL includes a variable frequency oscillator (VCO) and a phase detector in a feedback loop. The VCO generates a periodic signal, and the phase detector compares the phase of that signal with the phase of the input reference signal, adjusting the oscillator to keep the phases matched (or setting the frequency of the output signal to be a multiple of the frequency of the reference signal).

To the extent that other phases are desired, the PLL circuit provides a single output signal (e.g., a main clock signal), and derives one or more additional output signals (e.g., other clock signals) from the main clock signal using a delay-locked loop (DLL) circuit. The DLL circuit temporally shifts the output signal to provide the desirable delay for each additional output signal. However, undesirable delays are often introduced by the DLL over time (otherwise known as drift) based on the DLL's manufacturing processes, operating voltages, and the temperature of the DLL circuit. Thus, there is a need for a PLL circuit that can provide one or more output signals with different phases and frequencies in a stable, reliable and efficient manner.

SUMMARY

Various implementations of systems, methods and devices within the scope of the appended claims each have several aspects, no single one of which is solely responsible for the attributes described herein. Without limiting the scope of the appended claims, after considering this disclosure and particularly after considering the section entitled "Detailed Description," one will understand how the aspects of various implementations are used to provide a plurality of clock signals having different phases with reference to a reference output signal in a PLL circuit. Specifically, the PLL circuit described herein includes a voltage controlled oscillator (VCO), and provides the plurality of phase-shifted output signals (i.e., clock signals) in parallel via the VCO coupled at an output interface of the PLL circuit. One or more of the plurality of clock signals are independently selected by one or more multiplexers, and applied to drive electronic circuits that are external to and distinct from the PLL circuit. As such, the PLL circuit provides one or more phased clock signals in a simple, reliable and versatile manner.

In one aspect of the application, an electronic device includes a phase locked loop (PLL) circuit having a VCO. The PLL circuit is configured to generate a plurality of periodic signals having a first frequency. Each of the plurality of periodic signals has a distinct phase. Optionally, the plurality of periodic signals are equally separated in phase to cover an entire period cycle of the first frequency. The electron- In another aspect of the application, a method is implemented at an electronic device to provide periodic signals having adjustable phases. The electronic device includes a PLL circuit having a VCO, a first multiplexer coupled to and external to the PLL circuit, and a controller circuit coupled to the first multiplexer. The method includes generating by the PLL a plurality of periodic signals having a first frequency. Each of the plurality of periodic signals has a distinct phase. Optionally, the plurality of periodic signals are equally separated in phase to cover an entire period cycle of the first frequency. The method further includes providing by the controller circuit a first selection signal to the first multiplexer, selecting by the first multiplexer a first periodic signal of the plurality of periodic signals based on the first selection signal, and providing by the first multiplexer the first selected periodic signal to a first clock-driven circuit that is distinct from the PLL.

In another aspect of the application, a method is implemented to construct an electronic device. The method includes providing a PLL circuit including a VCO. The PLL circuit is configured to generate a plurality of periodic signals having a first frequency. Each of the plurality of periodic signals has a distinct phase. Optionally, the plurality of periodic signals having the first frequency are equally separated in phase to cover an entire period cycle of the first frequency. The method further includes providing a first multiplexer coupled to the PLL circuit. The first multiplexer is external to the PLL. The first multiplexer is configured to receive a first selection signal, select a first periodic signal of the plurality of periodic signals based on the first selection signal, and provide the first selected periodic signal to a first clock-driven circuit that is distinct from the PLL. The method further includes providing a controller circuit coupled to the first multiplexer, and the controller circuit is configured to provide the first selection signal to the first multiplexer.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

FIGS. 11A-11B are flow diagrams showing a method of constructing an electronic device in accordance with some embodiments.

DETAILED DESCRIPTION

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known processes, components, and materials have not been described in exhaustive detail so as not to unnecessarily obscure pertinent aspects of the embodiments described herein.

In accordance with various embodiments of the application, a phase lock loop (PLL) circuit is configured to provide a plurality of clock signals having different phase shifts with reference to a reference clock signal. Specifically, the PLL circuit includes a voltage controlled oscillator (VCO), and provides the plurality of clock signals having different phase shifts in parallel via the VCO coupled at an output interface of the PLL circuit. One or more of the plurality of clock signals are independently selected by one or more multiplexers, and applied to drive electronic circuits (e.g., an analog-to-digital converter) that are external to and distinct from the PLL circuit. By these means, the PLL circuit can provide one or more phased clock signals without using any delay-locked loop circuit. For example, in the PLL circuit described herein, a variation of duty cycles of the plurality of clock signals can be controlled below 1% across predetermined variations of manufacturing processes, operating voltages and temperatures.

Figure 1:
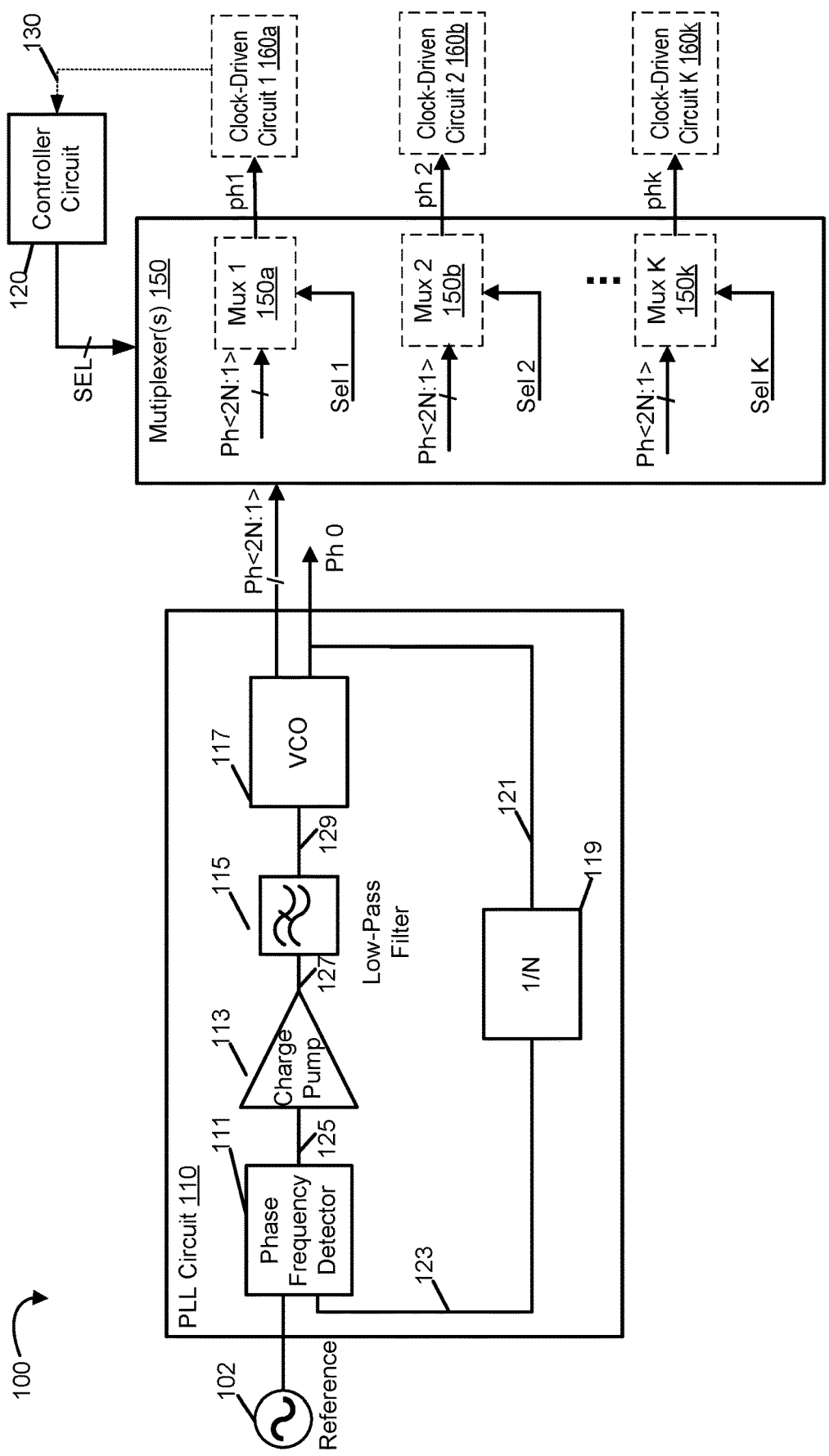
FIG. 1 illustrates an electronic device with a PLL circuit configured to provide multiple adjustable phase outputs in accordance with some embodiments.

FIG. 1 illustrates an electronic device system 100 that provides one or more adjustable phase outputs in accordance with some embodiments. The electronic device system 100 includes a PLL circuit 110 having a VCO 117, one or more multiplexers 150, and a controller circuit 120. The PLL circuit 110 is configured to generate a plurality of periodic signals having a first frequency. Each of the plurality of periodic signals has a distinct phase. Optionally, the plurality of periodic signals having the first frequency is equally separated in phase to cover an entire period cycle of the first frequency. In some embodiments, the PLL circuit 110 is coupled to a reference signal 102, and configured to output phases of the plurality of periodic signals with reference to that of the reference signal 102. The reference signal 102 has a frequency that is equal to the first frequency and/or is a factor of the first frequency.

In some embodiments, one or more multiplexers 150 are coupled to the PLL circuit 110 and each of the one or more multiplexers 150 configured to receive the plurality of periodic signals from the PLL circuit. Optionally, the one or more multiplexers are distinct from and external to the PLL circuit 110. The one or more multiplexers 150 are coupled to a controller circuit 120 that is configured to provide one or more selection signals to the one or more multiplexers 150. The one or more multiplexers 150 thereby select a subset of the plurality of periodic signals under the control of the one or more selection signals. It is noted that in some embodiments, the one or more selection signals provided to the multiplexers 150 are determined based on the plurality of periodic signals generated by the PLL circuit, and the controller circuit 120 is coupled to the PLL circuit 110 and configured to receive the plurality of periodic signals from the PLL circuit 110. As such, the one or more multiplexers 150 receive the one or more selection signals and select one or more respective periodic signals of the plurality of periodic signals based on the one or more selection signals.

The one or more multiplexers 150 are coupled to one or more clock-driven circuits 160 that are external to and distinct from the PLL circuit 110. The one or more multiplexers 150 are configured to provide the one or more respective periodic signals to the one or more clock-driven circuits 160. In some embodiments, the one or more respective periodic signals compensate for a respective phase mismatch (e.g. a phase difference and/or delay) in an output of a respective clock-driven circuit 160 with respect to a reference output. In some embodiments, the one or more respective periodic signals compensate for a respective phase mismatch (e.g. a phase shift and/or delay) caused by a respective signal path. In some embodiments, the one or more respective periodic signals are selected to compensate for the respective phase mismatch and synchronize the output of the respective clock-driven circuit 160 and/or signal path with the reference signal 102. That said, each of the one or more selection signals used to select a respective periodic signal is determined by the respective phase mismatch, such that the output and the corresponding signal path of the respective clock-driven circuits 160 are compensated and synchronized with reference signal 102.

In an example, a clock-driven circuit 160a is configured to provide a clock feedback signal 130 associated with an associated phase mismatch of the clock-driven circuit 160a to the controller circuit 120, which is thereby controlled by the clock feedback signal 130 to output a selection signal SEL. The multiplexer 150a that drives the clock-driven circuit 160a is controlled by the selection signal SEL to output one of the plurality of periodic signals provided by the PLL 110 to the clock-driven circuit 160*a* to compensate for its associated phase mismatch.

In some embodiments, the one or more multiplexers 150 include a first multiplexer 150*a*, a second multiplexer 150*b*, up to a k-th multiplexer 150*k*. In some embodiments, each of the multiplexers 150 is distinct from and operates independently from other multiplexers 150. In some embodiments, each of the multiplexers 150 is external to and coupled to the PLL circuit 110, and the PLL circuit 110 provides the plurality of periodic signals to each of the multiplexers. In some embodiments, each of the multiplexers 150 is configured to receive a respective one of the one or more selection signals SEL from the controller circuit 120. In some embodiments, each of the multiplexers 150 is configured to select a respective periodic signal of the plurality of periodic signals based on the respective one of the one or more selection signals. In some implementations, each multiplexer 150 includes a decoding circuit (e.g., circuit 700 in FIG. 7A) and a switching circuit (e.g., circuit 800 in FIG. 8A). The selection signal SEL provided by the controller circuit 120 includes a plurality of parallel signals that are decoded to control a switch associated with each of the plurality of periodic signal. For example, the selection signal SEL includes 3 parallel signals decoded to generate 5-8 control signals. The 5-8 control signals are used to control 5-8 switches to select one of 5-8 periodic signals provided by the PLL 110, and the selected periodic signal is thereby outputted by the corresponding multiplexer 150.

In some embodiments, each of the multiplexers 150 is configured to provide the respective selected periodic signal to one or more clock-driven circuits 160 that are distinct from the PLL circuit 110. In some embodiments, each of the one or more clock-driven circuits 160 is distinct from any other clock-driven circuit of the one or more clock-driven circuits 160. In some embodiments, each of the one or more clock-driven circuits 160 is separate from each other. In an example, in some embodiments, the first multiplexer 150*a*, the second multiplexer 150*b*, . . . and the k-th multiplexer 150*k* provide a first periodic signal, a second periodic signal , . . . and a k-th periodic signal to a first clock-driven circuit 160*a*, a second clock-driven circuit 160*b*, . . . and a k-th clock-driven circuit 160*k* , respectively.

Further, in some embodiments, two of the one or more clock-driven circuits 160 are distinct from each other. The two of the one or more clock-driven circuits 160 are optionally identical to each other (i.e., is the same type of circuit), or different from each other (i.e., are two types of circuits). In some embodiments, one of the one or more clock-driven circuits 160 is coupled to two or more multiplexers 150 each of which provides a respective periodic signal. The phases of the periodic signals provided by the two or more multiplexers 150 are not equal to each other. Optionally, the phases of the periodic signals provided by the two or more multiplexers 150 are independently selected from the plurality of periodic signal generated by the PLL circuit 110. Optionally, the phases of the periodic signals provided by the two or more multiplexers 150 are related to each other.

In some embodiments, the controller circuit 120 is coupled to each of the plurality of multiplexers 150. In some embodiments, the controller circuit 120 is configured to receive one or more clock feedback signals 130 from the clock-driven circuits 160 and provide respective selection signals to each of the multiplexers. In some embodiments, each of the multiplexers (e.g. Mux 1 150*a*, Mux 2 150*b* Mux k 150*k*) receive a respective selection signal (Sel, 1, Sel. 2, etc.), select a respective periodic signal of the plurality of periodic signals based on the respective selection signals, and provide the respective periodic signal to one or more clock-driven circuits 160 that are distinct from the PLL circuit 110. In some embodiments, each of the one or more clock-driven circuits 160 is distinct. In some embodiments, the one or more clock-driven circuits 160 are separate from each other.

In some embodiments, the PLL circuit 110 includes one of a phase frequency detector 111, charge pump 113, low pass filter 115, a voltage-controlled oscillator (VCO) 117, and a frequency divider 119. The phase frequency detector 111 is configured to compare a returned signal 123 coupled from an output 121 of the VCO 117 with the reference signal 102 and determine a phase difference 125 between the returned signal and the reference signal. The charge pump 113 is coupled to the phase frequency detector 111, and configured to convert the phase difference 125 to a phase-based voltage 127. The VCO is coupled to the charge pump 113 via a low pass filter 115, and configured to adjust the first frequency of its output signals using the filtered phase-based voltage 129. The frequency divider 119 is coupled between the VCO 117 and the phase frequency detector 111, and configured to control the first frequency of the output signals of the PLL to be a multiple (N) of the frequency of the reference signal 102. When N is equal to 1, the first frequency of the output signals of the PLL is equal to the frequency of the reference signal 102. Alternatively, when N is an integer larger than 1, the first frequency of the output signals is a multiple of the frequency of the reference signal 102.

Figure 2:
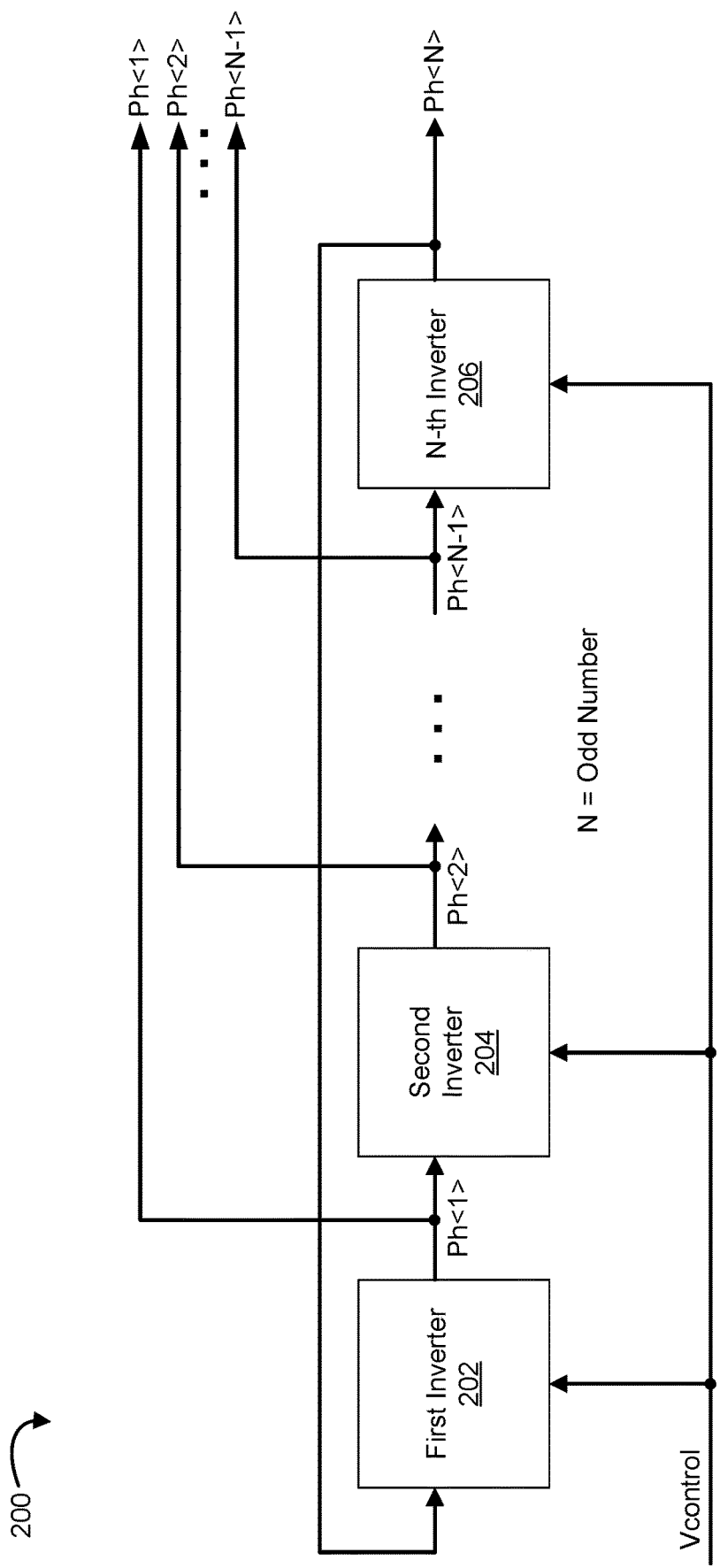
FIG. 2 illustrates a single-ended delay VCO, in accordance with some embodiments.

FIG. 2 illustrates an example single-ended VCO 200 in accordance with some embodiments. The single-ended VCO 200 includes a number of (e.g., N stages of) single-ended inverters 202, 204, 206, that are coupled in series to form a closed loop. The single-ended VCO 200 is also called a ring oscillator. In some embodiments, the VCO 117 of the PLL circuit includes a single-ended VCO 200. An output of each of the single-ended inverters is configured to provide one of the plurality of periodic signals outputted by the PLL circuit 110. That said, each of the plurality of periodic signals includes a signal-ended periodic signal.

The single-ended VCO 200 (i.e., the ring oscillator) provides a uniform voltage gain and a phase shift of 360 degrees. Each delay cell includes one of the single-ended inverters (e.g. a first inverter 202, a second inverter 204, . . . , an n-th inverter 206), and provides a substantially uniform phase shift, e.g., a phase shift of 180/N, where N is the total number of inverters in the single-ended VCO 200. In some embodiments, a plurality of single-ended periodic signals are generated by the single-ended inverters of the VCO 200. In some embodiments, an additional 180 degree phase shift is added to each single-ended periodic signal outputted at an output (e.g., Ph<1>, Ph<2>, . . . , Ph<N>) of each inverter of the VCO 200 by inverting the respective single-ended periodic signal. Optionally, the plurality of single-ended periodic signals are equally separated in phase, covering half of the entire period cycle. In some embodiments, one or more of the plurality of single-ended periodic signals are selected via the one or more multiplexers 150 and provided to the one or more clock-driven circuits 160 (e.g., circuits 910 in FIGS. 9) coupled to the one or more multiplexers 150. In some embodiment, the single-ended VCO 200 includes an odd number of inverter stages.

Figure 3:
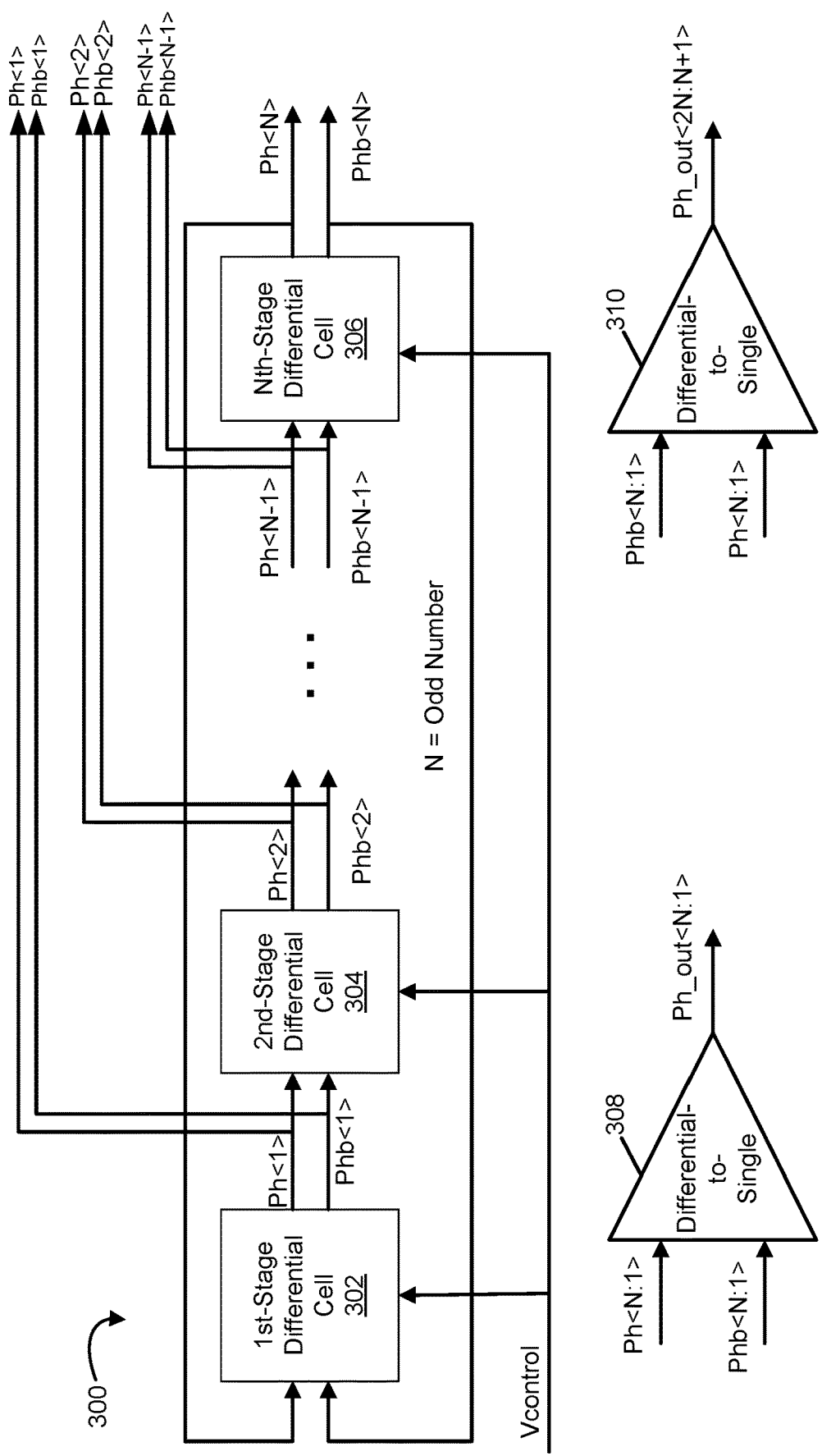
FIG. 3 illustrates a ring oscillator VCO with an odd number of differential delay cells in accordance with some embodiments.

FIG. 3 illustrates a ring oscillator VCO 300 with an odd number of differential delay cells in accordance with some embodiments. In some embodiments, the VCO 300 of the PLL circuit 110 includes a ring oscillator having an odd number of differential delay cells (e.g. 1st-stage differential cell 302, 2nd- stage differential cell 304, . . . Nth- stage differential cell 306). Each differential cell outputs a pair of differential outputs that are opposite in phase, and N stages of differential cells thereby provide a plurality of periodic signals (i.e., 2N periodic signals) outputted via the pair of differential outputs of each differential cell. The plurality of periodic signals can be equally separated in phase and cover an entire period cycle of a frequency of the plurality of periodic signals.

In some embodiments, the pair of differential outputs of each stage of the VCO 300 is converted to a single ended signal (e.g. Ph_out<N:1>) using a differential-to-single converter 308. By these means, the differential outputs from the odd number of differential delay cells provide a first plurality of single ended signals Ph_out<N:1>, and the first plurality of single ended signals Ph_out<N:1> are equally separated by 180 degrees and cover a first phase delay range from 0 to 180·(N−1)/N degrees. In some embodiments, the first plurality of single ended signals Ph_out<N:1> is inverted (e.g., shifted by 180 degrees) to provide a second plurality of single ended signals Ph_out<2N:N+1>. Alternatively, in some embodiments, each pair of differential outputs is swapped and converted to a respective one of the second plurality of single ended signals (e.g. Ph_out<2N:N+1>) via another differential-to-single converter 310 directly. The second plurality of single ended signals Ph_out<2N:N+1> covers a second phase delay range (e.g. from 180 to 360−180/N degrees) that is complementary to the first phase delay range. In some embodiments, the first plurality of single ended signals Ph_out<N:1> and the second plurality of single ended signals Ph_out<2N:N+1> correspond to a plurality of periodic signals and are equally separated in phase, and cover the entire period cycle. Stated another way, each single ended signal Ph_out<2N:1> outputted by the VCO 300 includes one of the plurality of periodic signals, and each of the plurality of periodic signals corresponds to a pair of differential outputs provided by a respective differential cell. In some embodiments, one or more of the plurality of periodic signals are selected via the one or more multiplexers 150 and provided to the one or more clock-driven circuits 160.

Figure 4:
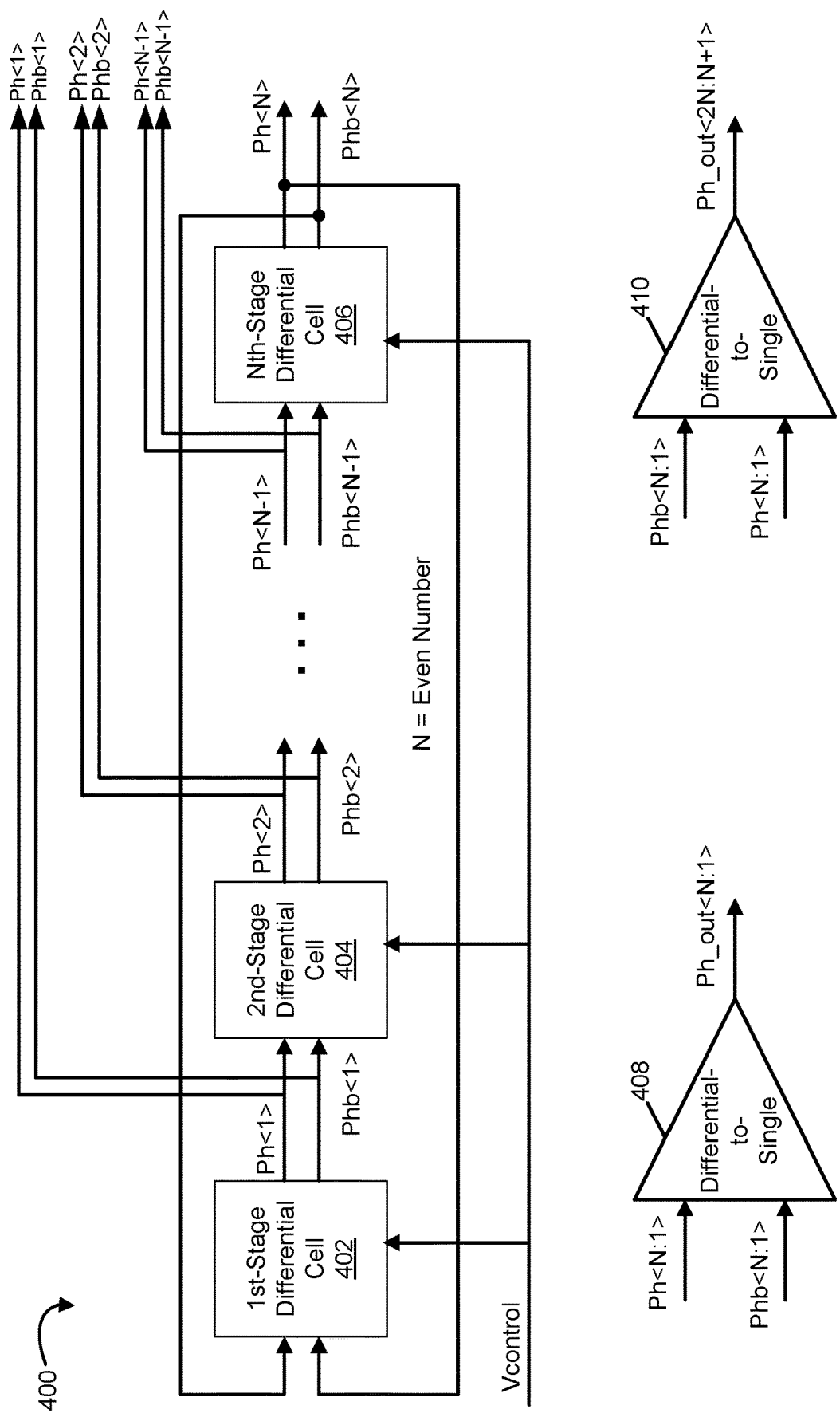
FIG. 4 illustrates a ring oscillator VCO with an even number of differential delay cells in accordance with some embodiments.

FIG. 4 illustrates a ring oscillator VCO 400 with an even number of differential delay cells in accordance with some embodiments. In some embodiments, the VCO 400 of the PLL circuit 110 includes a ring oscillator having an even number of differential delay cells (e.g. 1st- stage differential cell 402, 2nd- stage differential cell 404 . . . Nth- stage differential cell 406). Each differential cell outputs a pair of differential outputs that are opposite in phase, and N stages of differential cells thereby provide a plurality of periodic signals (i.e., 2N periodic signals) outputted via the pair of differential outputs of each differential cell. The plurality of periodic signals can be equally separated in phase and cover an entire period cycle of a frequency of the plurality of periodic signals.

In some embodiments, the pair of differential outputs of each stage of the VCO 400 is converted to a single ended signal (e.g. Ph_out<N:1>) using a differential-to-converter 408. The differential outputs from the even number of differential delay cells provide a first plurality of single ended signals Ph_out<N:1>, and the first plurality of single ended signals Ph_out<N:1> are equally separated by 180/N degrees and cover a first phase delay range from 0 to 180·(N−1)/N degrees. In some embodiments, the first plurality of single ended signals Ph_out<N:1> is inverted (e.g., shifted by 180 degrees) to provide a second plurality of single ended signals Ph_out<2N:N+1>. Alternatively, in some embodiments, each pair of differential outputs is swapped and converted to a respective one of the second plurality of single ended signals (e.g. Ph_out<2N:N+1>) via another differential-to-single converter 410 directly. The second plurality of single ended signals Ph_out<2N:N+1> covers a second phase delay range (e.g. from 180 to 360−180/N degrees) that is complementary to the first phase delay range. In some embodiments, the first plurality of single ended signals Ph_out<N:1> and the second plurality of single ended signals Ph_out<2N:N+1> correspond to a plurality of periodic signals that are equally separated in phase and cover the entire period cycle. Stated another way, each single ended signal Ph_out<2N:1> outputted by the VCO 400 includes one of the plurality of periodic signals, and each of the plurality of periodic signals corresponds to a pair of differential outputs provided by a respective differential cell. In some embodiments, one or more of the plurality of periodic signals are selected via the one or more multiplexers 150 and provided to the one or more clock-driven circuits 160.

Figure 5:
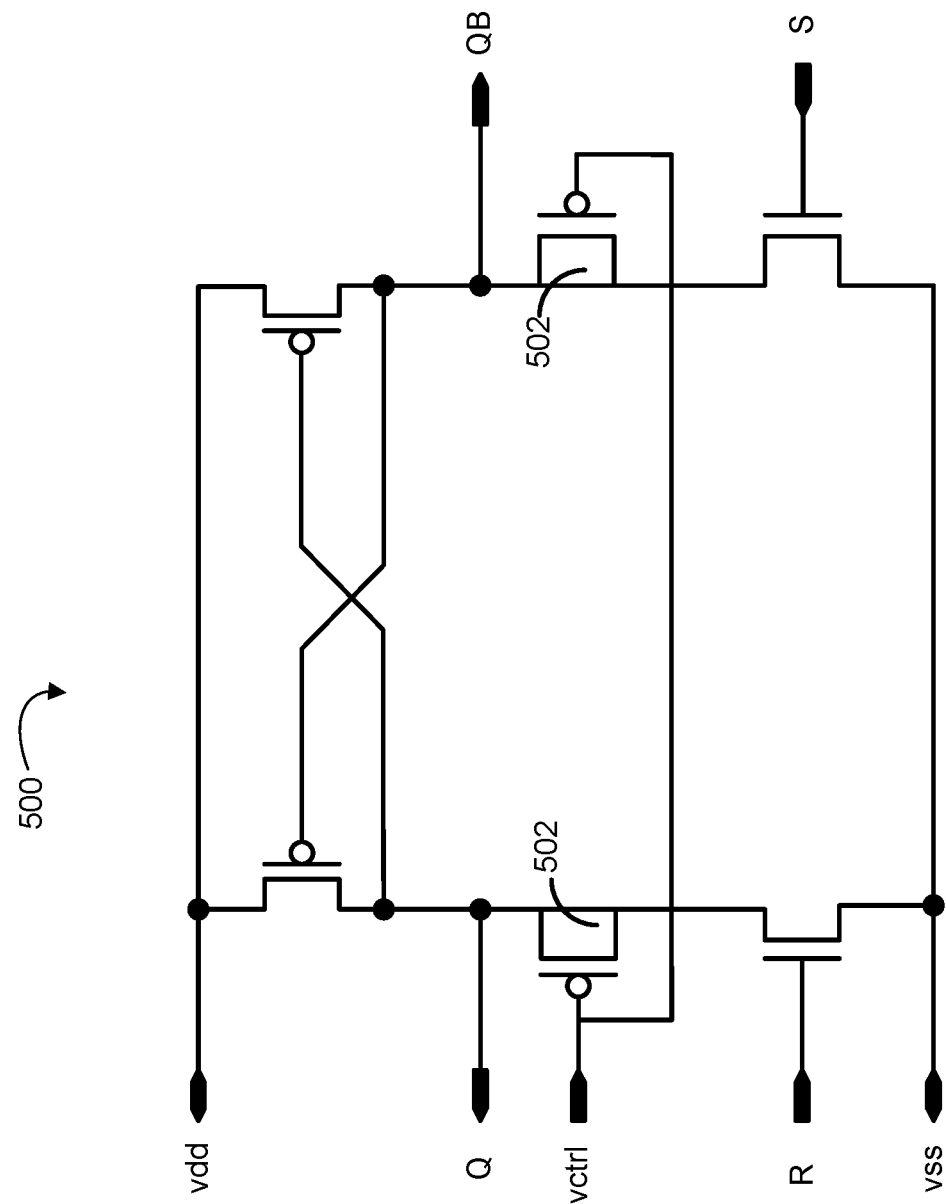
FIG. 5 illustrates a single differential cell used in a VCO shown in FIGS. 3 and 4 in accordance with some embodiments.

FIG. 5 illustrates an example of a single differential cell 500 used in a VCO shown in FIGS. 3 and 4 in accordance with some embodiments. A plurality of differential cells 500 is coupled in series to form a closed loop (i.e., a ring oscillator 300 or 400). The differential cell 500 has a pair of input ports R and S configured to receive a pair of differential input signals and a pair of output ports Q and QB configured to output a pair of differential output signals. For every two consecutive stages, input ports R and S of a second consecutive stage are coupled to output ports Q and QB of the first consecutive stage, and the pair of differential output signals of a first consecutive stage are thereby used as differential input signals of a second consecutive stage coupled.

The single differential cell 500 is biased between two power supplies vdd and vss, and includes a control signal vctrl. In some embodiments, the control signal vctrl is coupled to two P-type transistor 502, and configured to control the two P-type transistors 502 in the differential cell 500. A source and a drain of each of the two P-type transistors 502 are electrically coupled to each other. By these means, each P-type transistor 502 is applied as a capacitor coupled to an output of the single differential cell 500 to adjust a delay time associated with the cell 500. When the single differential cell 500 is used as a stage of the VCO 117, the dimension of the P-type transistor 502 is configured to adjust a frequency of the plurality of periodic signals generated by the VCO and a phase shift of each of the plurality of periodic signals. Alternatively, in some embodiments, the control signal vctrl is coupled to two N-type transistors (not shown), and configured to control the two N-type transistors in the differential cell 500. Optionally, a source and a drain of each of the two N-type transistors are electrically coupled to each other, such that each P-type transistor 502 is applied as a capacitor coupled to an output of the single differential cell 500 to adjust a delay time associated with the cell 500.

Figure 6:
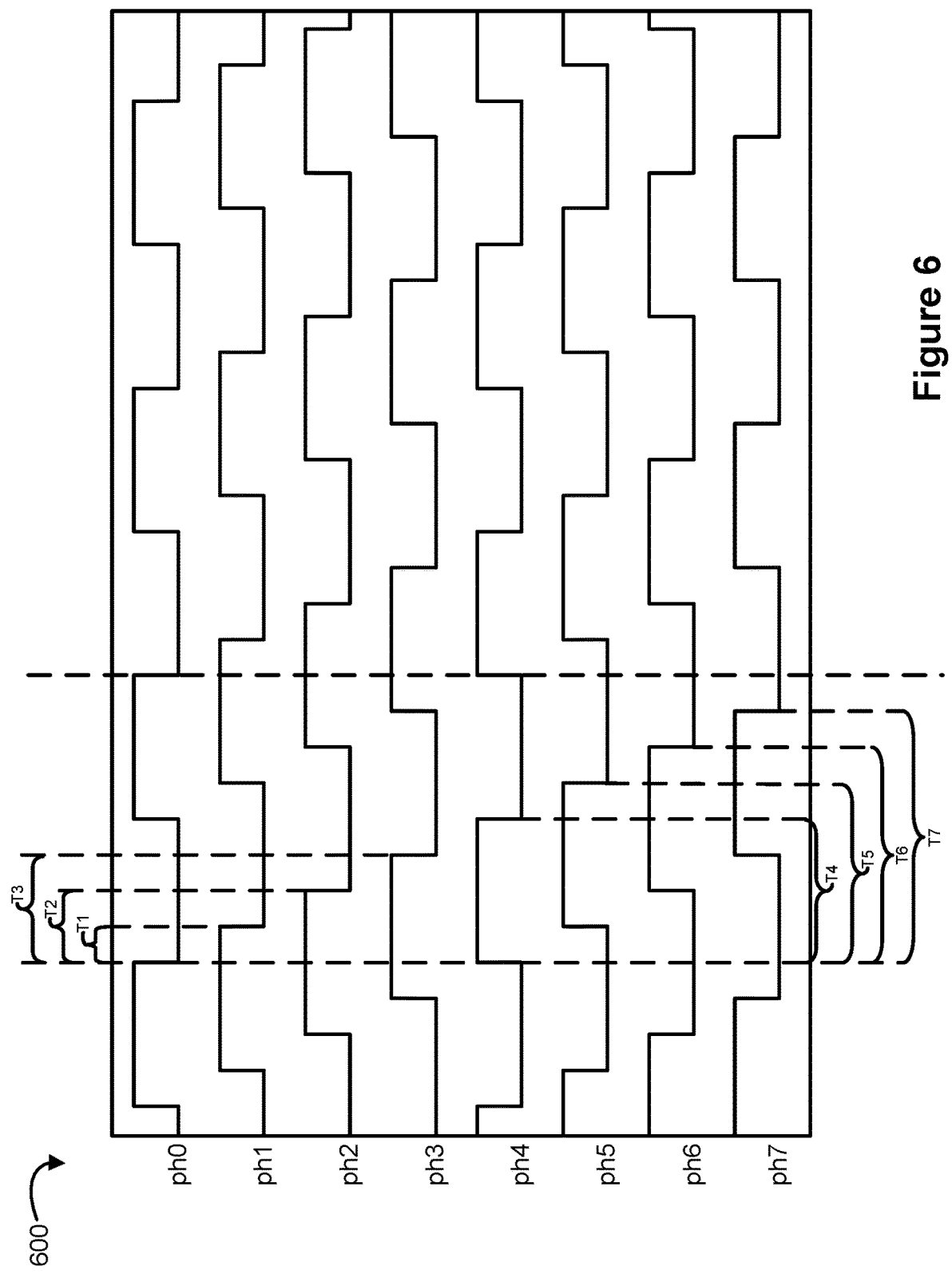
FIG. 6 illustrates a timing diagram of a plurality of periodic signals having a first frequency in accordance with some embodiments.

FIG. 6 illustrates an example VCO output timing diagram 600 of a plurality of periodic signals (e.g., ph0, ph1, ph2, . . . , and ph7) having a first frequency in accordance with some embodiments. Each of the plurality of periodic signals has a distinct phase. Optionally, the plurality of periodic signals is equally separated in phase to cover an entire period cycle of the first frequency. Each periodic signal other than a first periodic signal ph0 (e.g., ph1-ph7) has a respective phase shift (T1-T7) with respect to a reference periodic signal (e.g., the first periodic signal ph0). That said, every two periodic signals have a phase shift of 45 degrees. More details on determination of the phase shifts T1-T7 are discussed above with reference to FIGS. 2-4. For example, in some embodiments, the plurality of periodic signals includes a first plurality of single ended signals and a second plurality of single ended signals. The first plurality of single ended signals includes N single ended signals that are equally separated by 180/N degrees and covers a first phase delay range i.e., a half of a clock cycle, from 0 to 180·(N−1)/N degrees. The second plurality of single ended signals includes N inverter single ended signals that are also equally separated by 180/N degrees but covers a second phase delay range, i.e., the other half of the clock cycle, from 180 to 360−180/N degrees.

Figure 7A:
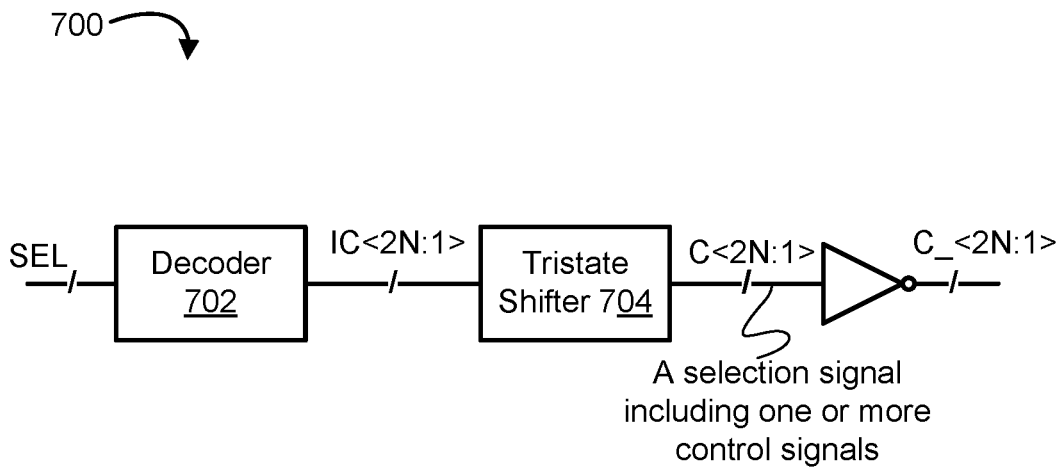
FIG. 7A illustrates a decoder circuit of a multiplexer for providing one or more selection signals to switches of one or more multiplexers in accordance with some embodiments.

FIG. 7A illustrates an example decoder circuit 700 for providing one or more selection signals SEL to switches of one or more multiplexers 150 in accordance with some embodiments. The controller circuit 120 is coupled to the one or more multiplexers 150 and is configured to provide each of the one or more multiplexers 150 with a respective selection signal SEL. In some embodiments, the decoder circuit 700 of each multiplexer 150 includes at least a decoder 702 configured to generate the one or more respective control signals for each multiplexer 150. Each of the one or more respective control signals (e.g., C<2N:1>) corresponds to one of the plurality of periodic signals (e.g., Ph<2N:1> in FIG. 1). In some embodiments, at each instant of time, only one of the one or more respective control signals is enabled to select a corresponding one of the plurality of periodic signals as an output signal of the respective multiplexer 150. In an example, the PLL circuit outputs a first number of (e.g., 8) periodic signals that are equally separated in phase, e.g., in FIG. 6. A first multiplexer 150a is optionally coupled to a second number of (e.g., 4) of the periodic signals. The second number is equal to or less than the first number. The controller circuit 120 provides a first selection signal to the first multiplexer 150a. The first selection signal is decoded by the decoder circuit 700 to the second number of control signals, and each control signal corresponds to a distinct one of the selectable periodic signals coupled to the first multiplexer 150a.

In some embodiments, the controller circuit 120 is configured to provide a selection signal to each the one or more multiplexers 150 to select one or more respective periodic signals. The one or more respective periodic signals are selected to compensate for phase mismatches (e.g. a phase difference and/or delay) coupled in outputs of one or more clock-driven circuits 160 and/or signal paths. In some embodiments, the controller circuit 120 determines the selection signals based on the respective phase mismatches in the outputs of the one or more clock-driven circuits 160 and/or signal paths. For example, a first clock-driven circuit 160a generates an output signal with a first phase mismatch (e.g., corresponding to a phase shift of $T_2$ in its clock signal in FIG. 6). The controller circuit 120 is configured to enable a first selection signal provided to a first multiplexer 150a, thereby controlling the first multiplexer 150a to select a first periodic signal (e.g., ph2 in FIG. 2) for the purposes of compensating the first phase mismatch. When the first multiplexer 150a provides the first periodic signal to the first clock-driven circuit 160a, the output signal of the first clock-driven circuit 160a is synchronized with a reference, e.g., the reference signal 102 or an output signal of another clock-driven circuit 160. That said, the first phase mismatch of the first clock-driven circuit 160a is negated by use of the first periodic signal.

In some implementations, a respective selection signal is provided to each of the one or more multiplexers 150 independently to compensate for the respective phase mismatch of the one or more clock-driven circuits 160 coupled to the respective multiplexer 150 independently (e.g., via the respective selected periodic signal). Additionally and/or alternatively, in some embodiments, the selection signal controlling each multiplexer 150 is provided to the respective multiplexer 150 independently to compensate for the respective phase mismatch generated by a corresponding signal path.

In some embodiments, the controller circuit 120 further includes a tristate shifter 704 configured to adjust phases of the selection signal (i.e., the one or more respective control signals) provided to each multiplexer 150. For example, the tristate shifter 704 may introduce a respective predetermined tristate time $T_{tri}$ between two consecutively enabled control signals provided to each multiplexer 150. In some embodiments, the respective predetermined tristate time $T_{tri}$ is less than a respective phase shift between any two distinct periodic signals selected from the plurality of periodic signals. In an example, the two consecutively enabled control signals include a first control signal and a second control signal that are enabled for controlling the first multiplexer 150a during two consecutive periods of time, i.e., during a first period of time and a second period of time that ensues the first period of time, respectively. The first multiplexer 150a is controlled to output a first periodic signal and a second periodic signal during the first and second periods of time, respectively. The predetermined tristate time $T_{tri}$ is added between the two consecutive periods of time, i.e., between an end of the first period of time and a start of the second period of time. During the predetermined tristate time $T_{tri}$, both the first and second control signals are disabled, such that a first periodic signals corresponding to the first selection signal is entirely disconnected from an output of the first multiplexer 150a before a second period signal corresponding to the second connection signal is connected to the output of the first multiplexer 150a. By these means, the plurality of periodic signals are protected from cross talking with each other.

Figure 7B:
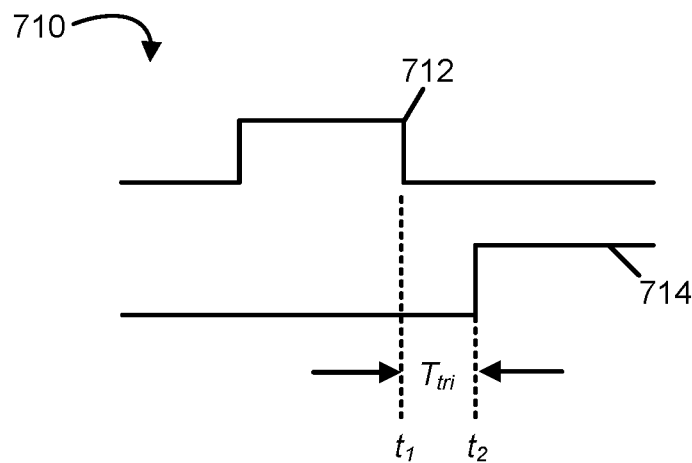
FIG. 7B illustrates an example selection phase adjustment corresponding to a predetermined tristate time in accordance with some embodiments.

FIG. 7B illustrates an example selection phase adjustment corresponding to a predetermined tristate time $T_{tri}$ in accordance with some embodiments. The selection signal is provided to a multiplexer 150 configured to select between two periodic signals, and thereby includes two corresponding control signals. The predetermined tristate time $T_{tri}$ is added between the two distinct selected periodic signals, such as a first periodic signal and an alternative periodic signal that is selected subsequently to the first periodic signal (e.g., a second periodic signal selected at a distinct time from the first periodic signal). In some embodiments, the tristate shifter 704 is configured to delay selection of the alternative periodic signal by the selection phase adjustment (e.g., the predetermined tristate time $T_{tri}$). For instance, a timing diagram 710 shows a predetermined tristate time $T_{tri}$ between the two control signals corresponding to the two distinct selected periodic signals; a first control signal 712 enabled at a first time $t_1$ for selecting the first periodic signal and a second control signal 714 enabled at a second time $t_2$ for selecting the second periodic signal. The predetermined tristate time $T_{tri}$ is added between the first and second selection signals 712 and 714, optionally by delaying a start of the second time $t_2$, to allow the first periodic signal to be entirely disconnected form the first multiplexer 150a.

In some embodiments, the predetermined tristate time $T_{tri}$ is less than a respective phase shift between any two distinct selected periodic signals of the plurality of periodic signals. For example, the first periodic signal 712 (e.g. ph2) and the second periodic signal 714 (e.g. ph5) have a first phase shift (e.g., $T_2$ in FIG. 6) and a second phase shift (e.g., $T_5$ in FIG. 6), respectively, and the predetermined tristate time $T_{tri}$ is less than the difference between respective phase shifts of the periodic signals, e.g., $T_5$-$T_2$. As such, the predetermined tristate time $T_{tri}$ enables a respective multiplexer of the one or more multiplexers 150 to efficiently provide periodic signals to one or more clock-driven circuits 160 without incurring crosstalk among the periodic signals.

Figure 8:
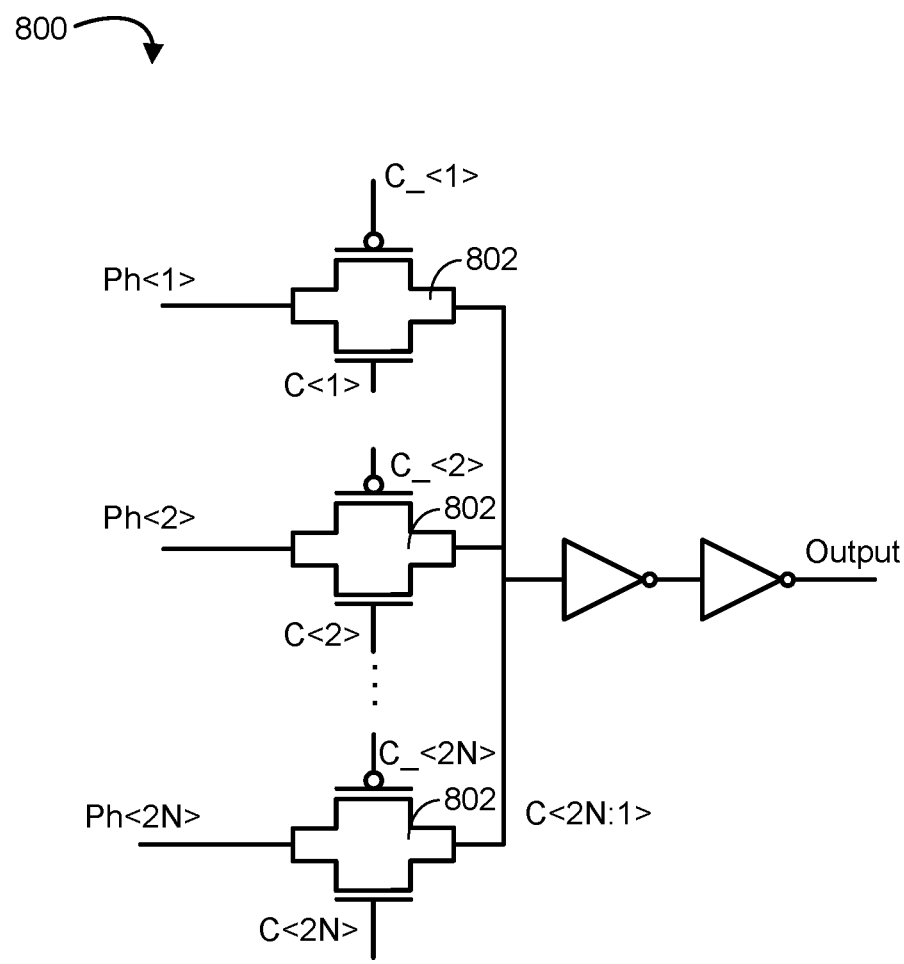
FIG. 8 illustrates an example switching circuit of a multiplexer in accordance with some embodiments.

FIG. 8 illustrates an example switching circuit 800 of a multiplexer 150 in accordance with some embodiments. Multiplexer 800 receives a plurality of periodic signals (Ph<1:2N>) from the PLL circuit 110 and a selection signal (including a plurality of control signals, e.g., C<1:2N> and C_<1:2N>) from the controller circuit 120. The switching circuit 800 selects each of the plurality of periodic signals based on respective control signals decoded from the selection signal, and provides the respective periodic signal to one or more clock-driven circuits 160 (not shown in FIG. 8). In some embodiments, a first control signal is enabled to allow the switching circuit 800 to output a first periodic signal based on the first control signal. After the first control signal is disabled, a second control signal is then enabled to allow the switching circuit 800 to output a second periodic signal based on the second control signal. The first periodic signal and the second periodic signal are distinct. In some embodiments, multiplexer 150 delays providing the second periodic signal to the one or more clock-driven circuits 160 based on a predetermined tristate time $T_{tri}$, e.g., via the tristate shifter 704. The predetermined tristate time $T_{tri}$ is configured to enable multiplexer 150 to efficiently provide subsequent periodic signals to the one or more clock-driven circuits 160 without causing crosstalk between sequentially outputted periodic signals coupled at inputs of the multiplexer 150. In some embodiments, the predetermined tristate time $T_{tri}$ is added between the first periodic signal and the second periodic signal by way of delaying a start time when the second control signal is enabled.

In an example, the switching circuit 800 includes a plurality of analog switches 802 each of which is coupled to the PLL circuit 110 and receives a respective one of the plurality periodic signals provided by the PLL circuit 110. Each switch 802 is controlled by a respective control signal, e.g., C<1:2N>, and is turned on to couple the respective one of the plurality of periodic signals to the output of the multiplexer 150 when the respective control signal is enabled. In some implementations, an analog switch 802 includes a P-type transistor and an N-type transistor controlled by a pair of complementary control signals (e.g., C<1> and C_<1>).

In some embodiments, the one or more multiplexers 150 include switching circuit 800. The one or more multiplexers 150 are externally coupled to the PLL circuit 110. Each of the one or more multiplexers 150 is configured to receive a subset or all of the plurality of periodic signals from the PLL circuit 110. Optionally, the multiplexer 150 is configured to operate independently from one or more other multiplexers of the multiplexers 150 and provide one or more selected periodic signals to one or more clock-driven circuits sequentially. In an example, each of a first multiplexer 150a (e.g., implemented as the multiplexer 150) and a second multiplexers 150b receives a respective selection signal, e.g., via the controller circuit 120. Each of the selection signals of the multiplexers 150a and 150b includes a first control signal corresponding to a first periodic signal (e.g., ph2 in FIG. 6). At a first instant of time, both of the first control signals of the multiplexers 150a and 150b are enabled, such that the multiplexers 150a and 150b are configured to provide the first periodic signal (e.g., ph1) to their corresponding clock-driven circuits 160. At a second instant of time distinct from the first instant of time, the first control signals of the multiplexers 150a and 150b are disabled. A second control signal received by the multiplexer 150a is enabled, and the multiplexer 150a is controlled to output a second periodic signal (e.g., ph2) corresponding to the second control signal. A third control signal received by the multiplexer 150b is enabled, and the multiplexer 150b is controlled to output a third periodic signal (e.g., ph3) corresponding to the third control signal. As such, the multiplexers 150a and 150b operate independently from each other at both the first and second instants of time, and the same periodic signal is provided by the multiplexers 150a and 150b at the first instant while distinct periodic signals are provided by the multiplexers 150a and 150b.

Figure 9:
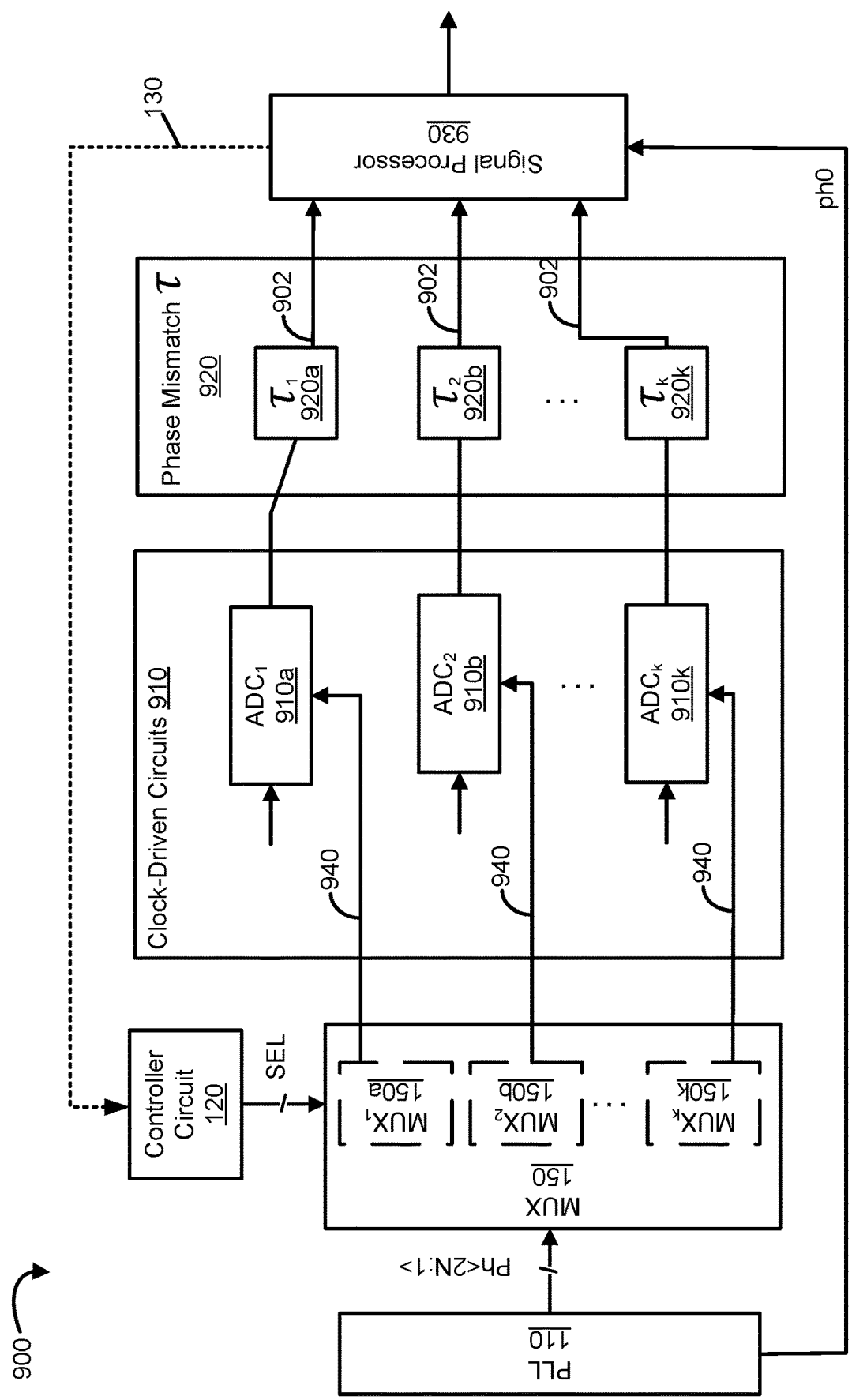
FIG. 9 illustrates a signal processing system 900 that compensates for phase mismatch using selectable periodic signals in accordance with some embodiments.

FIG. 9 illustrates a signal processing system 900 that compensates for phase mismatch using selectable periodic signals in accordance with some embodiments. The signal processing system 900 includes a plurality of clock-driven circuits 910 (e.g., analog to digital converters (ADC)) configured to provide a plurality input signals 902 to a signal processor 930. In some situations, each of the plurality of input signals 902 is provided by a distinct ADC via distinct signal paths, which causes the respective input signal 902 to be asynchronous with other input signals 902 when it reaches an input of the signal processor 930. Each of the one or more clock-driven circuits 910 is associated with a respective phase mismatch $\tau$920 (e.g., $\tau_1$ 920a, $\tau_2$ 920b ... $\tau_k$ 920k) with respect to a reference, e.g., the reference signal 102, one of the plurality of periodic signals or one or the input signals 902. Assume that the reference signal 102 is selected as the clock signals 940, i.e., to drive the clock-driven circuits 910, the respective phase mismatch $\tau$920 is seen at the plurality of input signals 902 to the signal processor 930 in association with each clock-driven circuit 910. For each clock-driven circuit 910, the respective phase mismatch $\tau$920 is caused by operation of the respective clock-driven circuit 910, the respective signal path or both of them. Optionally, the respective phase mismatch $\tau$is measured with respect to the reference signal 102. For each clock-driven circuit 910, a respective one of the plurality of periodic signals is selected by the multiplexer 150 to function as the clock signal 940 and drive the clock-driven circuit 910, thereby compensating for the respective phase mismatch $\tau$920 associated with each clock-driven circuit 910 and associated signal path.

In some embodiments, the signal processing system 900 enables the PLL circuit 110 to provide the plurality of periodic signals to one or more clock-driven circuits 910 concurrently, and the plurality of periodic signals is applied to compensate for phase mismatches of the plurality of input signals 920 caused by the clock-driven circuits 910 (i.e., ADCs 910a, 910b, 910k) and/or corresponding signal paths. The plurality of periodic signals provided by the PLL circuit 110 has a first frequency, and is selected for driving the clock-driven circuits 910 by the multiplexers 150 as described above in FIG. 1. In some embodiments, a controller circuit 120 is coupled to the one or more multiplexers 150, and is configured to provide the one or more multiplexers 150 with respective selection signals for selecting a subset of the plurality of periodic signals. The one or more multiplexers 150 include a first multiplexer 150a, a second multiplexer 150b, ... and a k-th multiplexer 150k. Each of the one or more multiplexers 150 is configured to select one or more respective periodic signals and provide the selected period signal to drive a respective clock-driven circuit 910.

In some implementations, the signal processor 930 is configured to provide a clock feedback signal 130 associated with associated phase mismatches of the clock-driven circuits 910 to the controller circuit 120, which is thereby controlled by the clock feedback signal 130 to output the selection signal SEL. The multiplexers 150 that drive the clock-driven circuits 910 are controlled by the selection signal SEL to output periodic signals 940 to the clock-driven circuits 910 to compensate for their associated phase mismatches. In some implementations, the controller circuit 120 is further coupled to the PLL circuit 110 to receive the plurality of periodic signals. For example, the controller circuit 120 is configured to determine phases of the plurality of periodic signals, identify a subset of the plurality of periodic signals based on the phases of the periodic signals, generate selection signals corresponding to the subset of selected periodic signals, and provide the selection signals to the one or more multiplexers 150.

In some embodiments, the one or more clock-driven circuits 910 include at least one analog-to-digital converter (ADC). In some embodiments, the one or more clock-driven circuits 910 are the same type of circuit. In some embodiments, at least two of the one or more clock-driven circuits 910 are separate from each other. For example, clock driven circuit $ADC_2$ 910b is located on a distinct signal path from $ADC_k$ 910k. Each of the one or more clock-driven circuits 910 is provided with and driven by a respective clock signal selected from the plurality of periodic signals that are synchronized with a reference with a respective phase. The respective clock signal is selected to compensate for a respective phase mismatches t generated by the respective clock-drive circuit 910 and/or signal path. When outputted by the clock-drive circuits 910 and provided to the signal processor 930, the plurality of input signals is synchronized at the input of the signal processor 930 for further processing therein.

As an illustrative example of the electronic device described herein, in some embodiments, an electronic device includes a first multiplexer 150a, a second multiplexer 150b, and a third multiplexer 150k coupled to the PLL circuit 110. The first multiplexer 150a, second multiplexer 150b, and third multiplexer 150k are distinct from and operate independently from each other. The first multiplexer 150a, second multiplexer 150b, and third multiplexer 150k are configured to provide respective selected periodic signals to a first clock-driven circuit $ADC_1$ 910a, a second clock-driven circuit $ADC_2$ 910b, and a third clock-driven circuit $ADC_k$ 910k, respectively. In some embodiments, the first clock-driven circuit $ADC_1$ 910a and the second clock-driven circuit $ADC_2$ 910b are the same type of circuits and the third clock-driven circuit $ADC_k$ 910k is a distinct type of circuit. The first clock-driven circuit $ADC_1$ 910a, second clock-driven circuit $ADC_2$ 910b, and third clock-driven circuit $ADC_k$ 910k are configured to operate in parallel. Each of the first clock-driven circuit $ADC_1$ 910a, second clock-driven circuit $ADC_2$ 910b, and third clock-driven circuit $ADC_k$ 910k is associated with a respective phase mismatch $\tau$ 920 (e.g., $\tau_1$ 920a, $\tau_2$ 920b ... $\tau_k$ 920k). The provided respective selected periodic signals (from the respective multiplexers) are configured to compensate for the respective phase mismatches $\tau$920 such that after the respective selected periodic signals have been provided to the first clock-driven circuit $ADC_1$ 160a, second clock-driven circuits $ADC_2$ 910b, and third clock-driven circuit $ADC_k$ 910k, respectively, the respective outputs from the clock-driven circuit are synchronized with each other. That said, the respective outputs of the clock-driven circuits 910 are provided to the signal processor 930 in a synchronous manner.

Figure 10:
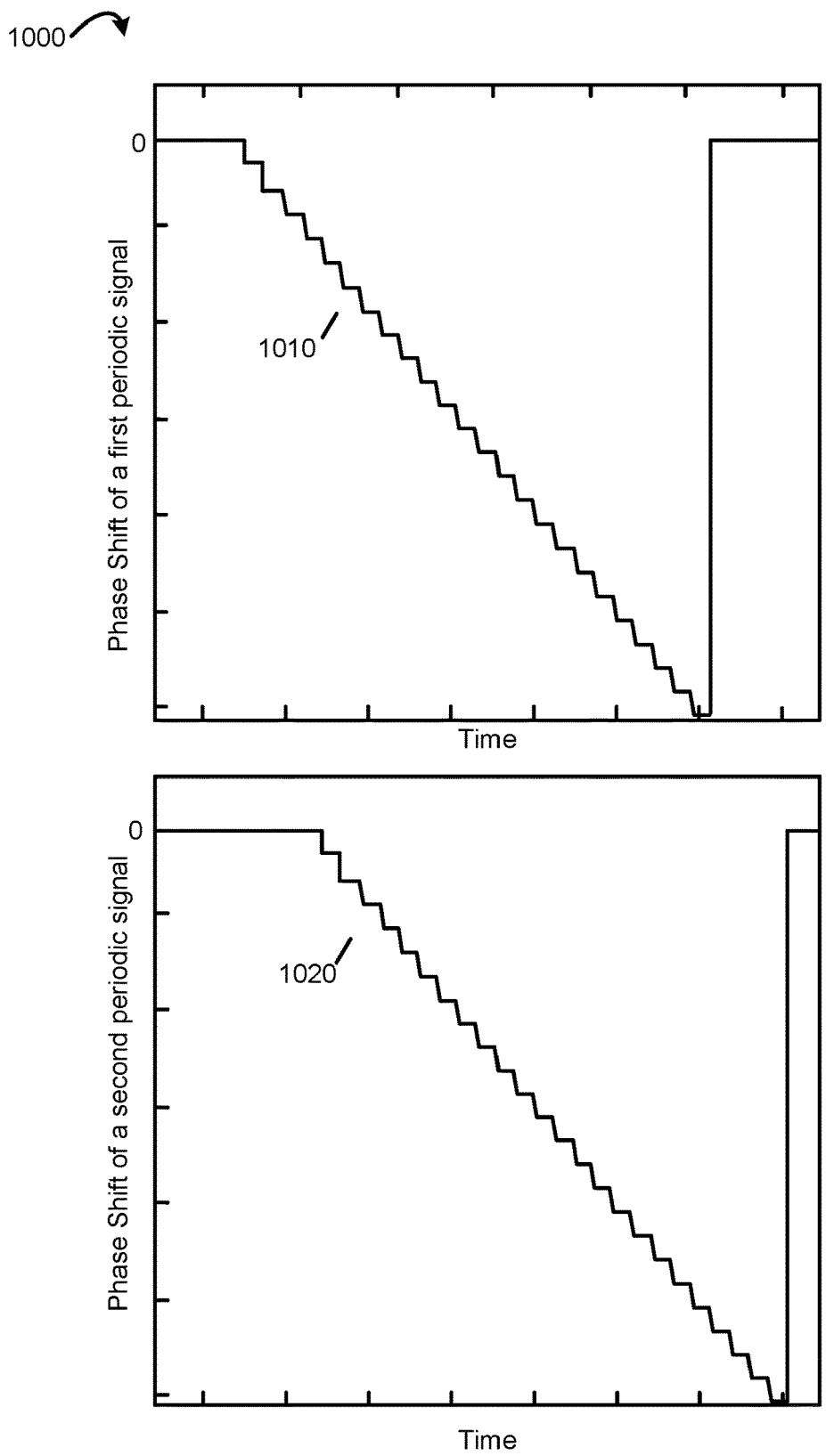
FIG. 10 illustrates phase shifts of two periodic signals that are independently selected and have different phases in accordance with some embodiments.

FIG. 10 illustrates two time diagrams 1000 of phase shifts of two periodic signals that are independently selected and have different phases in accordance with some embodiments A first phase shift curve 1010 and a second phase shift curve 1020 are temporally recorded with reference to a reference signal 102 for a first periodic signal and a second periodic signal that are outputted two multiplexers 150a and 150b, respectively. In each curve 1010 or 1020, the multiplexers 150a or 150b is controlled to sequentially scan through the plurality of periodic signals, and the first or second periodic signal therefore shows a respective phase shift that varies temporally with the sequential scan. In some implementations, each of these phase shifts of the first and second periodic signals is selected and applied to compensate for an output phase shift of a clock-driven circuit (e.g., the ADC 910 shown in FIG. 9).

FIGS. 11A-11B illustrate flow diagrams of a method 1100 for constructing an electronic device in accordance with some embodiments. The method 1100 of constructing an electronic device includes providing (1102) a phase locked loop (PLL) circuit 110 including a voltage-controlled oscillator (VCO) 117. The PLL circuit 110 is configured to generate a plurality of periodic signals. In some implementations, the plurality of periodic signals has a first frequency. Each of the plurality of periodic signals has a distinct phase. Optionally, the plurality of periodic signals is equally separated in phase to cover an entire period cycle of the first frequency. The method includes providing (1104) a first multiplexer 150a coupled to the output of the PLL circuit 110. The first multiplexer 150a is external to the PLL circuit 110 and configured to receive a first selection signal, select a first periodic signal of the plurality of periodic signals based on the first selection signal, and provide the first selected periodic signal to a first clock-driven circuit 160a that is distinct from the PLL circuit 110. In some embodiments, the first selected periodic signal is selected (1106) to compensate for a phase mismatch $\tau_1$ 920a generated by the first clock-driven circuit 160a with a reference, thus synchronizing the output of the first clock-driven circuit 160a with the reference. The reference is optionally the reference signal 102, one of the plurality of periodic signals, or one of the outputs of the clock-driven circuits 160. In some embodiments, the method includes providing (1108) a second multiplexer 150b coupled to the output of the PLL circuit 110. The second multiplexer 150b is configured to receive a second selection signal, and select a second periodic signal of the plurality of periodic signals based on the second selection signal. The second multiplexer 150b is distinct from and operates independently from the first multiplexer 150a. The controller circuit 120 is further coupled to the second multiplexer 150b. The controller circuit 120 is configured to provide the second selection signal to the second multiplexer 150b.

In some embodiments, at a first time, the first selection signal of the first multiplexer 150a and the second selection signal of the second multiplexer 150b are the same, thereby allowing the first and second multiplexers 150a and 150b to separately select the same one of the plurality of periodic signals. At a second time distinct from the first time, the first selection signal of the first multiplexer 150a and the second selection signal of the second multiplexer 150b are different from one another, allowing the first and second multiplexers 150a and 150b to select two distinct periodic signals of the plurality of periodic signals (1110). In some embodiments, the second multiplexer 150b is external to the PLL circuit 110 and configured to provide the second selected periodic signal to a second clock-driven circuit 160b that is distinct from the first clock-driven circuit 160a, and the first and second periodic signals are selected to compensate for a respective phase mismatch (e.g., $\tau_1$ 920a and/or $\tau_2$ 920b) generated by the first clock-driven circuit 160a and the second clock-driven circuit 160b and in respective outputs of the clock-driven circuits 160a and 160b, thus synchronizing(1112) the respective outputs of the first clock-driven circuit 160a and second clock-driven circuits 160b.

Alternatively and/or additionally, in some embodiments, the controller circuit 120 is coupled to the PLL circuit 110 and configured to receive the plurality of periodic signals and determine the first selection signal according to the plurality of periodic signals. In some embodiments, the controller circuit 120 is coupled to the first clock-driven circuit 160a and configured to receive (1114) a clock feedback signal from the first clock-driven circuit 160a. The clock feedback signal is associated with a phase mismatch of the first clock-driven circuit 160a with reference to a reference. In some embodiments, the first multiplexer 150a is configured to select (1116) two distinct periodic signals sequentially and add a predetermined delay time (e.g., a tristate time $T_{tri}$) between sequential selections of the two distinct periodic signals. Optionally, in some embodiments, the two distinct periodic signals include (1118) the first periodic signal and an alternative periodic signal that is selected subsequently to the first periodic signal. The first selection signal includes a selection phase adjustment determined by the predetermined delay time (e.g., a tristate time $T_{tri}$), such that the first multiplexer 150a is configured to delay selection of the alternative periodic signal by the predetermined tristate time.

The method further includes, providing (1120) a controller circuit 120 coupled to the first multiplexer 150a. The controller circuit 120 is configured to provide the first selection signal to the first multiplexer 150a.

The terminology used in the description of the invention herein is for the purpose of describing particular embodiments only and is not intended to be limiting of the invention. As used in the description of the invention and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

It will also be understood that, although the terms "first," "second," etc. may be used herein to describe various elements, these elements should not be limited by these terms. These terms are only used to distinguish one element from another. For example, a first region could be termed a second region, and, similarly, a second region could be termed a first region, without changing the meaning of the description, so long as all occurrences of the "first region" are renamed consistently and all occurrences of the "second region" are renamed consistently. The first region and the second region are both regions, but they are not the same region.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. An electronic device, comprising:
   a phase locked loop (PLL) circuit including a voltage-controlled oscillator (VCO), the PLL circuit being configured to generate a plurality of periodic signals having a first frequency, each of the plurality of periodic signals having a distinct phase;
   a first multiplexer coupled to the PLL circuit, the first multiplexer being external to the PLL circuit and configured to receive a first selection signal, select a first periodic signal of the plurality of periodic signals based on the first selection signal and provide the first periodic signal to a first clock-driven circuit that is distinct from the PLL circuit; and
   a controller circuit coupled to the first multiplexer, the controller circuit being configured to provide the first selection signal to the first multiplexer;
   wherein the first multiplexer is configured to select two distinct periodic signals sequentially and add a predetermined tristate time between sequential selections of the two distinct periodic signals.

2. The electronic device of claim 1, wherein the first periodic signal is selected to compensate a phase mismatch in an output of the first clock-driven circuit and synchronize the output of the first clock-driven circuit with a reference.

3. The electronic device of claim 1, further comprising:
   a second multiplexer coupled to the PLL circuit, the second multiplexer being configured to receive a second selection signal and select a second periodic signal of the plurality of periodic signals based on the second selection signal, wherein the second multiplexer is distinct from and operates independently from the first multiplexer;
   wherein the controller circuit is further coupled to the second multiplexer, the controller circuit being configured to provide the second selection signal to the second multiplexer.

4. The electronic device of claim 1, wherein the controller circuit is coupled to the first clock-driven circuit and configured to receive a clock feedback signal from the first clock-driven circuit.

5. The electronic device of claim 1, wherein the two distinct periodic signals include the first periodic signal and an alternative periodic signal that is selected subsequently to the first periodic signal, the first selection signal including a selection phase adjustment determined by the predetermined tristate time, such that the first multiplexer is configured to delay selection of the alternative periodic signal by the predetermined tristate time.

6. The electronic device of claim 1, wherein each periodic signal includes a differential periodic signal made of two signals having opposite phases.

7. The electronic device of claim 1, wherein the first periodic signal includes a single-ended periodic signal.

8. The electronic device of claim 1, wherein the VCO includes a ring oscillator having an odd number of stages of inverters.

9. The electronic device of claim 1, wherein the VCO includes a ring oscillator having an even number of stages of inverters.

10. The electronic device of claim 1, wherein the first clock-driven circuit includes at least one analog-to-digital converter (ADC), and the first periodic signal is configured to compensate a phase mismatch associated with the ADC.

11. The electronic device of claim 1, wherein the plurality of periodic signals is equally separated in phase to cover an entire period cycle of the first frequency.

12. An electronic device, comprising:
a phase locked loop (PLL) circuit including a voltage-controlled oscillator (VCO), the PLL circuit being configured to generate a plurality of periodic signals having a first frequency, each of the plurality of periodic signals having a distinct phase;
a first multiplexer coupled to the PLL circuit, the first multiplexer being external to the PLL circuit and configured to receive a first selection signal, select a first periodic signal of the plurality of periodic signals based on the first selection signal and provide the first periodic signal to a first clock-driven circuit that is distinct from the PLL circuit;
a second multiplexer coupled to the PLL circuit, the second multiplexer being configured to receive a second selection signal and select a second periodic signal of the plurality of periodic signals based on the second selection signal, wherein the second multiplexer is distinct from and operates independently from the first multiplexer;
a controller circuit coupled to the first and second multiplexers, the controller circuit being configured to provide the first and second selection signals to the first and second multiplexers, respectively;
wherein the first selection signal of the first multiplexer and the second selection signal of the second multiplexer are the same at a first time, allowing the first and second multiplexers to select the same one of the plurality of periodic signals separately; and
wherein the first selection signal of the first multiplexer and the second selection signal of the second multiplexer are different from each other at a second time distinct from the first time, allowing the first and second multiplexers to select two distinct ones of the plurality of periodic signals.

13. The electronic device of claim 12, wherein each periodic signal includes a differential periodic signal made of two signals having opposite phases.

14. The electronic device of claim 12, wherein the plurality of periodic signals is equally separated in phase to cover an entire period cycle of the first frequency.

15. An electronic device, comprising:
a phase locked loop (PLL) circuit including a voltage-controlled oscillator (VCO), the PLL circuit being configured to generate a plurality of periodic signals having a first frequency, each of the plurality of periodic signals having a distinct phase;
a first multiplexer coupled to the PLL circuit, the first multiplexer being external to the PLL circuit and configured to receive a first selection signal, select a first periodic signal of the plurality of periodic signals based on the first selection signal and provide the first periodic signal to a first clock-driven circuit that is distinct from the PLL circuit;
a second multiplexer coupled to the PLL circuit, the second multiplexer being configured to receive a second selection signal and select a second periodic signal of the plurality of periodic signals based on the second selection signal, wherein the second multiplexer is distinct from and operates independently from the first multiplexer;
a controller circuit coupled to the first and second multiplexers, the controller circuit being configured to provide the first and second selection signals to the first and second multiplexers, respectively;
wherein the second multiplexer is external to the PLL circuit and configured to provide the second periodic signal to a second clock-driven circuit that is distinct from the first clock-driven circuit; and
the first and second periodic signals are selected to compensate a phase mismatch in outputs of the first and second clock-driven circuits and synchronize the outputs of the first and second clock-driven circuits.

16. The electronic device of claim 15, wherein the first and second clock-driven circuits are the same type of circuits, and are separate from each other.

17. The electronic device of claim 15, further comprising:
a third multiplexer coupled to the PLL circuit, the third multiplexer being configured to receive a third selection signal and select a third periodic signal of the plurality of periodic signals based on the third selection signal, wherein the third multiplexer is distinct from and operates independently from the first and second multiplexers; and
the third multiplexer is configured to provide the third periodic signal to a third clock-driven circuit that is distinct from and coupled separately from the first and second clock-driven circuits;
the first and second clock-driven circuits are the same type of circuits and are configured to operate in parallel, the third clock-driven circuit having a type distinct from that of the first and second clock-driven circuits; and
the third periodic signal is selected to compensate the phase mismatch between the third clock-driven circuit and the first and second clock-driven circuits.

18. The electronic device of claim 15, wherein each periodic signal includes a differential periodic signal made of two signals having opposite phases.

19. The electronic device of claim 15, wherein the first periodic signal includes a single-ended periodic signal.

20. The electronic device of claim 15, wherein the plurality of periodic signals is equally separated in phase to cover an entire period cycle of the first frequency.

* * * * *